US008785868B2

(12) United States Patent
Yang et al.

(10) Patent No.: US 8,785,868 B2
(45) Date of Patent: Jul. 22, 2014

(54) INTELLIGENT UV RADIATION SYSTEM

(71) Applicant: Fusion UV Systems, Gaithersburg, MD (US)

(72) Inventors: Yixin Yang, Rockville, MD (US); William E. Johnson, III, Burke, VA (US); Pradyumna Kumar Swain, North Potomac, MD (US); Michael Kenneth West, Beltsville, MD (US); Charles Hudson Wood, Rockville, MD (US); David Xu, Potomac, MD (US); Darrin Leonhardt, Gaithersurg, MD (US); Mahmood Gharagozloo, Gaithersurg, MD (US)

(73) Assignee: Heraeus Noblelight Fusion UV Inc., Gaithersburg, MD (US)

(*) Notice: Subject to any disclaimer, the term of this patent is extended or adjusted under 35 U.S.C. 154(b) by 124 days.

(21) Appl. No.: 13/680,882

(22) Filed: Nov. 19, 2012

(65) Prior Publication Data

US 2014/0138550 A1 May 22, 2014

(51) Int. Cl.
*H01L 27/146* (2006.01)
*B05D 3/06* (2006.01)

(52) U.S. Cl.
CPC ........................................ *B05D 3/06* (2013.01)
USPC ...................................................... 250/370.08

(58) Field of Classification Search
CPC ......... H05B 37/00; H05B 37/03; H05B 41/36
USPC ...................................................... 250/370.08
See application file for complete search history.

(56) References Cited

U.S. PATENT DOCUMENTS

| | | | | |
|---|---|---|---|---|
| 4,749,436 | A * | 6/1988 | Minato et al. | 156/345.1 |
| 6,457,846 | B2 * | 10/2002 | Cook et al. | 362/321 |
| 6,847,170 | B2 * | 1/2005 | Kayser | 315/117 |
| 8,289,144 | B2 * | 10/2012 | Zhu et al. | 340/447 |
| 2008/0067425 | A1 * | 3/2008 | Kaszuba et al. | 250/492.2 |

* cited by examiner

*Primary Examiner* — Kiho Kim
(74) *Attorney, Agent, or Firm* — Lowenstein Sandler LLP

(57) ABSTRACT

An "intelligent" UV curing assembly is disclosed. The "intelligent" assembly permits automated monitoring of performance parameters, part lifetime, and inventory control of internal parts. The "intelligent" assembly includes an on lamp microprocessor. The on lamp microprocessor may be configured to recognize the internal parts, record accumulated working time of each part, and sample and process data from the plurality of "intelligent" sensors.

20 Claims, 8 Drawing Sheets

INTELLIGENT UV RADIATION SYSTEM

FIELD OF THE INVENTION

The invention relates generally to ultraviolet (UV) curing lamp assemblies, and more particularly, to a UV curing lamp assembly that includes on-board intelligence for automated inventory and monitoring of internal parts.

BACKGROUND OF THE INVENTION

Radiant energy is used in a variety of manufacturing processes to treat surfaces, films, and coatings applied to a wide range of materials. Specific processes include, but are not limited to, curing (i.e., fixing, polymerization), oxidation, purification, and disinfection. Processes employing radiant energy to polymerize or effect a desired chemical change are rapid and often less expensive compared to a thermal treatment. The radiation can also be localized to control surface processes and allow preferential curing only where the radiation is applied. Curing can also be localized within the coating or thin film to interfacial regions or in the bulk of the coating or thin film. Control of the curing process is achieved through selection of the radiation source type, physical properties (for example, spectral characteristics), spatial and temporal variation of the radiation, and curing chemistry (for example, coating composition).

A variety of radiation sources are used for curing, fixing, polymerization, oxidation, purification, or disinfections applications. Examples of such sources include, but are not limited to, photon, electron, or ion beam sources. Typical photon sources include, but are not limited to, arc lamps, incandescent lamps, electrodeless lamps and a variety of electronic and solid-state sources (i.e., lasers). Conventional arc type UV lamp systems and microwave-driven UV lamp systems use tubular bulb envelopes made of fused quartz glass or fused silica.

FIG. 1 is a perspective view of a microwave-powered UV curing lamp assembly showing an irradiator and a light shield assembly in the prior art. FIG. 2 is a partial cross-sectional view of the lamp assembly of FIG. 1 showing a half-elliptical primary reflector and a light source of circular cross-section. FIG. 3 is a partial cross-sectional internal view of the light shield assembly of FIG. 1 showing a half-elliptical primary reflector and a light source of circular cross-section mated to a secondary reflector and end reflectors.

Referring now to FIGS. 1-3, the apparatus 10 includes an irradiator 12 and a light shield assembly 14. The irradiator 12 includes a primary reflector 16 having a generally smooth half-elliptical shape with openings 18 for receiving microwave radiation to excite a light source 20 (to be discussed herein below), and a plurality of openings 22 for receiving air flow to cool the light source 20. The light source 20 includes a lamp (e.g., a modular lamp, such as a microwave-powered lamp having a microwave-powered bulb (e.g., tubular bulb with a generally circular cross-section) with no electrodes or glass-to-metal seals). The light source 20 is placed at the internal focus of the half-ellipse formed by the primary reflector 16. The light source 20 and the primary reflector 16 extend linearly along an axis in a direction moving out of the page (not shown). A pair of end reflectors 24 (one shown) terminate opposing sides of the primary reflector 16 to form a substantially half-elliptical reflective cylinder. The light shield assembly 14 of FIGS. 1-3 includes a secondary reflector 25 having a substantially smooth elliptical shape. A second pair of end reflectors 26 (one shown) terminates opposing sides of the secondary reflector 25 to form a substantially half-elliptical reflective cylinder.

A work piece tube 30 of circular cross-section is received in circular openings 28 in the end reflectors 26. The center of the openings 28 and the axis of the work piece tube 30 are typically located at the external focus of the half-ellipse formed by the primary reflector 16 (i.e., the foci of the half-ellipse formed by the secondary reflector 25). The work piece tube 28 and the secondary reflector 25 extend linearly along an axis in a direction moving out of the page (not shown).

In operation, gas in the light source 20 is excited to a plasma state by a source of radio frequency (RF) radiation, such as a magnetron 29 located in the irradiator 12. The atoms of the excited gas in the light source 20 return to a lower energy state, thereby emitting ultraviolet light (UV). Ultraviolet light rays 38 radiate from the light source 20 in all directions, striking the inner surfaces of the primary reflector 16, the secondary reflector 25, and the end reflectors 24, 26. Most of the ultraviolet light rays 38 are reflected toward the central axis of the work piece tube 30. The light source 20 and reflector design are optimized to produce the maximum peak light intensity (lamp irradiance) at a surface of a work product (also propagating linearly out of the page) placed inside the work piece tube 30.

FIG. 4 shows a plurality of cable connections between the irradiator 12 of FIGS. 1-3 and a conventional external power supply 40. Current irradiators manufactured by Fusion UV Systems of Gaithersburg, Md. are powered with high voltage DC and monitored for analog parameters, such as the detection and measurement of radio-frequency (RF) and ultraviolet (UV) radiation leakage. The external power supply 40 includes a three-phase power cable 42 for receiving conventional AC power. The external power supply 40 converts AC power to high voltage DC power in the range of 4 kV-7 kV DC. The high voltage DC power is applied to a high voltage HV cable 44 that extends between the external power supply 40 and the irradiator 12. The HV cable 44 typically includes seven analog signal wires (not shown): two wires for carrying the High Voltage (HV) DC power to the irradiator 12; two wires for powering a filament associated with a microwave-powered UV-emitting bulb 20 (i.e., the light source 20); one wire each for a photo detector and a pressure switch sensor; and a seventh wire for a cable interlock. An RF cable 46 for monitoring microwave leakage conditions is located between the external power supply 40 and an RF detector 48, which needs to be mounted close to the irradiator 12.

Unfortunately, the currently employed cables 44, 46 between the external power supply 40 and the irradiator 12 have a number of drawbacks. The cables 44, 46 have a limited range due to losses in the cable. Current irradiators 12 are not user friendly for product upgrading, standardizing and compatibility. For example, certain critical monitorable parameter, including UV power, temperature, air pressure, and part type require the installation of additional sensors inside the irradiator 12. The cables 44, 46 do not permit changes necessary to accommodate remote monitoring of the above-cited parameter because of limited I/O and significant tethering that requires close proximity of the external power supply 40 to the irradiator 12.

Current irradiators 12 do not permit the monitoring of UV output power that emanates from the UV-emitting bulb 20. Each UV-emitting bulb 20 is not identical in its UV output power. There are certain UV curing applications where multiple UV-emitting bulbs 20 are mounted adjacent to one another. Manual adjustments are required to lower or increase the voltage to equalize variations in UV output power from lamp to lamp. Therefore, it would be desirable to permit automatic monitoring and adjustment of UV output power.

Currently employed pressure switches (not shown) do not permit real time monitoring of air pressure inside the irradiator 12. The rate of flow of air inside the irradiator 12 is critical to the life of the UV-emitting bulb 20 and the magnetron 29. It is therefore desirable to install a monitorable pressure sensor that can transmit real time data back to a controller. Further, a monitorable pressure sensor can be integrated with a "smart blower" to automatically manage airflow and changing of speed of the "smart blower" based on data received from the monitorable pressure sensor.

Accordingly, what would be desirable, but has not yet been provided, is a microprocessor-controlled UV curing irradiator for monitoring internal sensors for performance parameters, part lifetime, and inventory control without necessitating major changes to a high voltage power supply.

SUMMARY OF THE INVENTION

The above-described problems are addressed and a technical solution is achieved in the art by providing an "intelligent" irradiator that permits automated monitoring of performance parameters, part lifetime, and inventory control of internal parts. The irradiator includes an on lamp microprocessor. The on lamp microprocessor may be configured to recognize internal parts, record accumulated working time for each part, sample and process data from the plurality of sensors, and communicate with a master computer processor located within an external "intelligent" power supply via a serial bus cable.

According to an embodiment of the present invention, the on lamp microprocessor is configured to communicate with a plurality of intelligent markers (IMs) associated with one or more internal magnetrons and an internal primary reflector. The intelligent markers may comprise at least one of a radio frequency identification tag (RFID) or a small footprint microcontroller adhered to each part to be monitored. The on lamp microprocessor communicates with the IMs via standard serial links such as a serial peripheral interface (SPI) bus. The on lamp microprocessor also communicates with a plurality of analog/digital sensors that includes one or more temperature detectors operating as a bulb recognizer (BR), an air pressure sensor for detecting a rate of air flow from an internal fan within the irradiator, a UV power sensor, and an RF detector for microwave leaking detection.

The "intelligent" irradiator communicates with an "intelligent" external power supply modified to include a master computer processor for controlling the irradiator and reading data processes by the on lamp microprocessor over a digital serial communication bus for communication between the irradiator and the power supply using an inexpensive standard communication protocol (e.g., CAN bus).

BRIEF DESCRIPTION OF THE DRAWINGS

The present invention may be more readily understood from the detailed description of an exemplary embodiment presented below considered in conjunction with the attached drawings and in which like reference numerals refer to similar elements and in which.

It is to be understood that the attached drawings are for purposes of illustrating the concepts of the invention and may not be to scale.

DETAILED DESCRIPTION OF THE INVENTION

Figure 2:
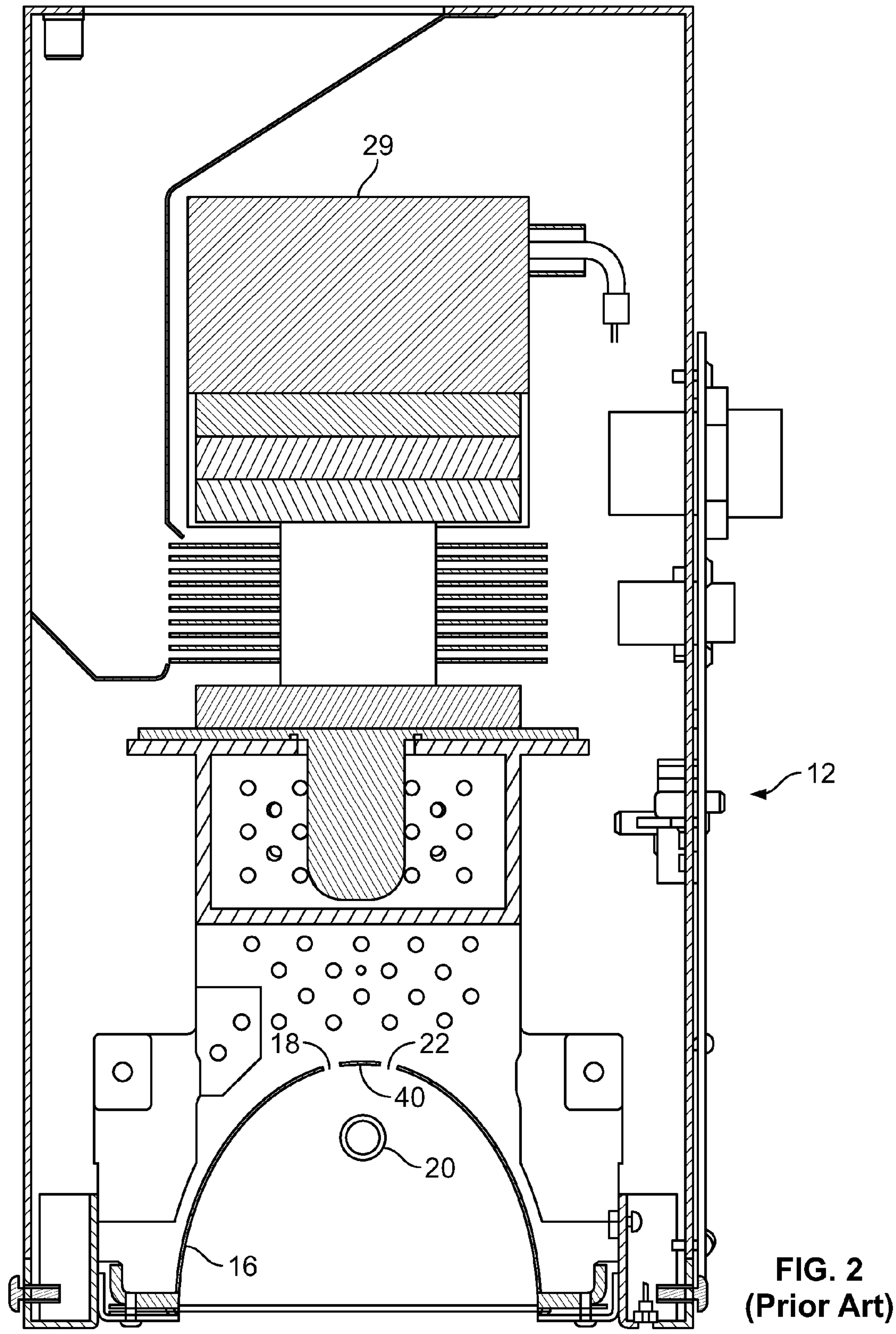
FIG. 2 (Prior Art)
FIG. 2 is a partial cross-sectional view of the lamp assembly of FIG. 1 showing a half-elliptical primary reflector and a light source of circular cross-section.
Figure 5:
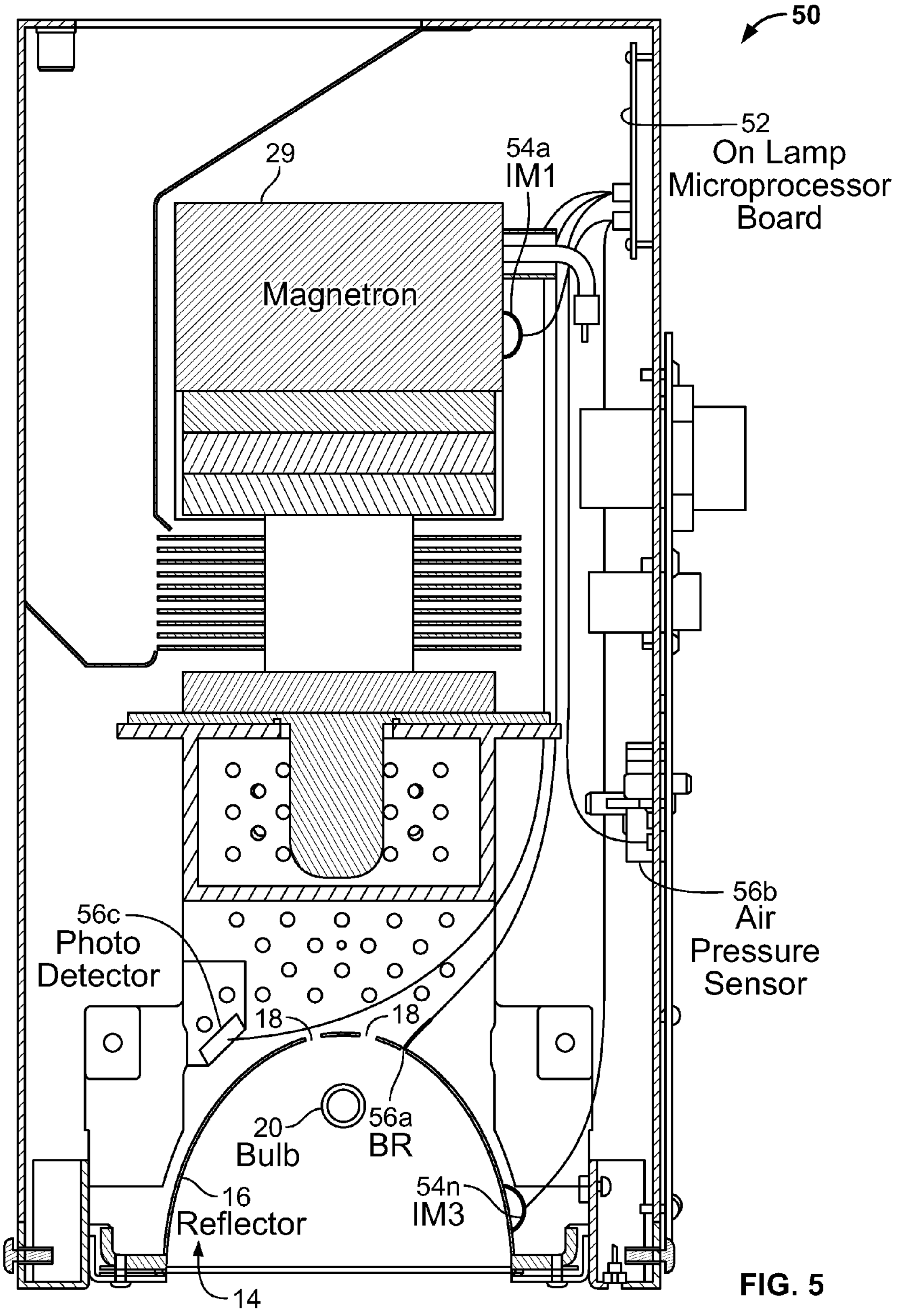
FIG. 5 is a partial cross-sectional view of the irradiator of FIG. 2 modified to include intelligent control, according to an embodiment of the present invention.

FIG. 5 is a partial cross-sectional view of the UV curing irradiator 12 of FIG. 2 modified to include intelligent control (i.e., an irradiator 50), according to an embodiment of the present invention. The irradiator 50 includes an on-lamp microprocessor board 52, a plurality of intelligent markers 54*a*-54*n* (labeled IMl-IMn), and a plurality of sensors 56*a*-56*n* (e.g., a bulb recognizer labeled BR 56*a*, an air pressure sensor 56*b*, and a photo detector 56*c*), configured as shown. The placement of the components 52, 54*a*-54*n*, and 56*a*-56*n* in FIG. 5 represents a preferred, though not exclusive layout. A description of each of the intelligent components 52, 54*a*-54*n*, and 56*a*-56*n* is presented in connection with FIG. 6 hereinbelow.

Figure 6:
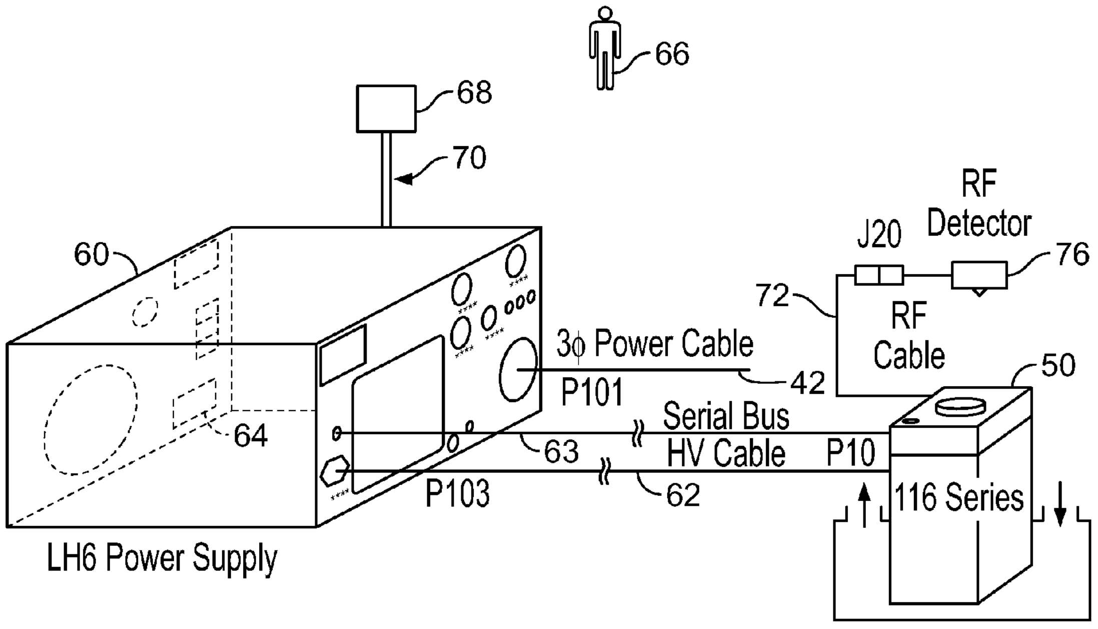
FIG. 6 shows a plurality of cable connections between the irradiator of FIG. 5 and an external power supply modified to operate with the irradiator, according to an embodiment of the present invention.

FIG. 6 depicts a plurality of cable connections between the irradiator 50 and an external power supply 60 modified to operate with the irradiator 50, according to an embodiment of the present invention. The external power supply 60 includes a three-phase power cable 42 for receiving conventional AC power. The external power supply 60 converts AC power to high voltage DC power in the range of 4 kV-7 kV DC. The high voltage DC power is applied to a modified high voltage (HV) cable 62 extending between the external power supply 60 and the irradiator 50. The HV cable 62 includes two wires for carrying the High Voltage (HV) DC power and a plurality of additional conductors for controlling and monitoring of the filament current of the magnetron 29. A serial bus cable 63 includes two or more digital serial communication wires for communication between the external power supply 60 and the irradiator 50 using a standard serial communication protocol (e.g., a CAN bus). A master computer processor 64 within the external power supply 60 is configured to control and receive serial data to/from the on-lamp microprocessor board 52. The master computer processor 64 is also configured to communicate with an external intelligent control system (not shown) for receiving commands from and presenting data to a user 66 on a monitor 68 over a standard serial link 70 (e.g., CAN bus). An RF cable 72 for monitoring microwave radiation leakage from the irradiator 50 extends from the external power supply 60 to an RF detector 76. Note that the RF cable 72 associated with the RF detector 76 is generally a short local cable compared to a relatively long cable connected between the irradiator 12 and the external power supply 40 of FIG. 2.

Figure 7:
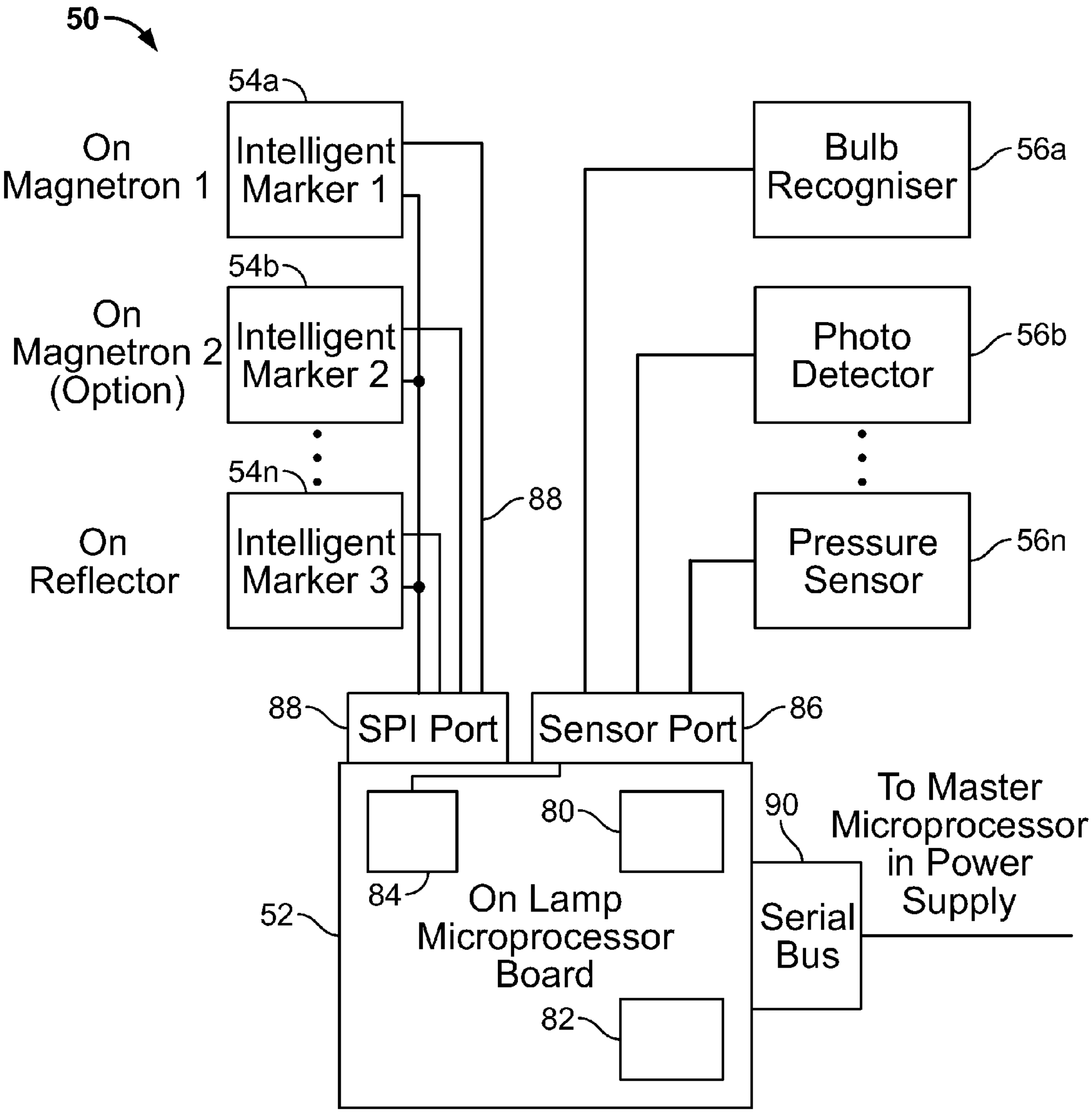
FIG. 7 is an electrical schematic block diagram of the on lamp microprocessor board mounted within the irradiator of FIGS. 5 and 6, according to an embodiment of the present invention.

FIG. 7 is an electrical schematic block diagram of the on lamp microprocessor board 52 mounted within the irradiator 50 of FIGS. 5 and 6, according to an embodiment of the present invention. The on lamp microprocessor board 52 includes an on lamp microprocessor 80 in signal communication with a computer-readable storage medium 82 (i.e., volatile and non-volatile memory, such as RAM and Flash memory, respectively). The on lamp microprocessor 80 may be any commercial 8/16 bit microprocessor having sufficient speed to process command and data from the plurality of sensors 56*a*-56*n* via an 8 channel analog-to-digital converter (ADC) 84 via a sensor port 86. The on lamp microprocessor 80 further controls and reads digital data from the plurality of intelligent markers 54*a*-54*n* (labeled IMl-IMn) via a serial bus 88 and serial bus port 90 that employs a standard serial bus protocol that may be, but is not limited to, the Serial Peripheral Interface bus (SPI bus) protocol.

According to an embodiment of the present invention, on lamp microprocessor 80 may be configured to: (1) recognize parts, including one or two magnetrons 29 associated with the intelligent markers IM1 and IM2, respectively, the primary reflector 16 associated with the intelligent marker IM3, and, the microwave-powered, UV-emitting bulb 20 (i.e., the light source 20) associated with the bulb recognizer (BR); (2) record accumulated working time for each part, which is storable in non-volatile memory (i.e., the computer-readable storage medium 82); (3) sample and process data from the plurality of sensors 56*a*-56*n*, which may include, but are not limited to, one or more temperature sensors 56*a* operating as the bulb recognizer (BR) for detecting the type of the UV-emitting bulb 20, an air pressure sensor 56*b* for detecting the rate of air flow from an internal fan (not shown) within the irradiator 50, a photo detector 56*c* for measuring UV light output from the irradiator 50, and other optional sensors such as a filament current sensor and an HV cable interlock (not shown); and (4) communicate with the master computer processor 64 within external power supply 60 via the serial bus cable 63.

Parts may be recognized by analog/digital means via the plurality of sensors 56*a*-56*n* over the sensor port 86 (e.g., the bulb recognizer (BR)) and digital means via the intelligent markers 54*a*-54*n* (labeled IMl-IMn) over the serial bus port 90. As used herein, an intelligent marker (IM) refers to, but is not limited to, a semiconductor chip that permanently maintains manufacturing information, such as, but not limited to, a produced date, a part number, and a life time limit. The irradiator 50 may include, but is not limited to, one or both of two types of IMs: a radio frequency identification tag (RFID) or a small footprint microcontroller. An IM may be permanently adhered to a part using epoxy or other adhesive.

Figure 8A:
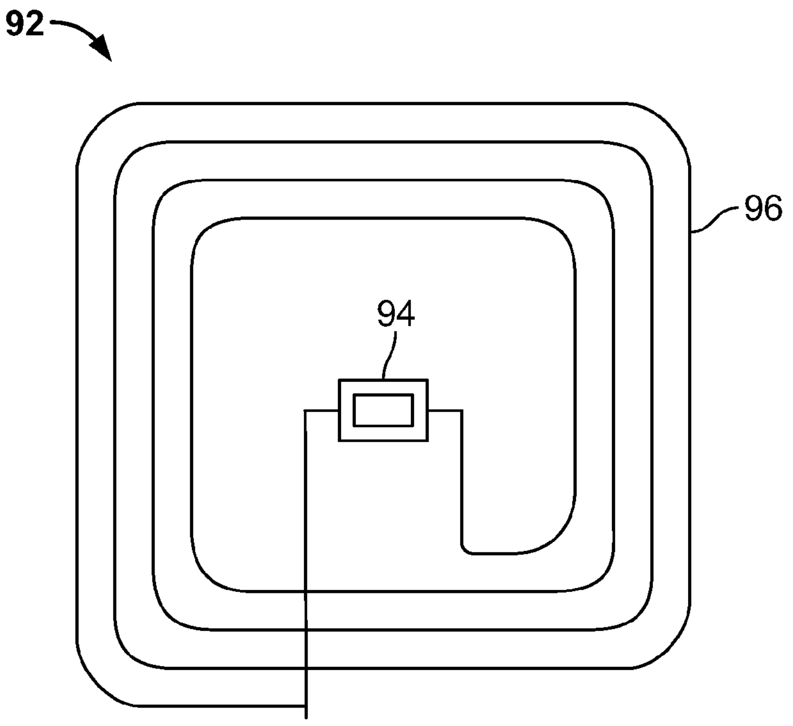
FIG. 8A depicts a conventional RFID tag having a semiconductor chip and a coiled antenna located within a common plane.
Figure 8B:
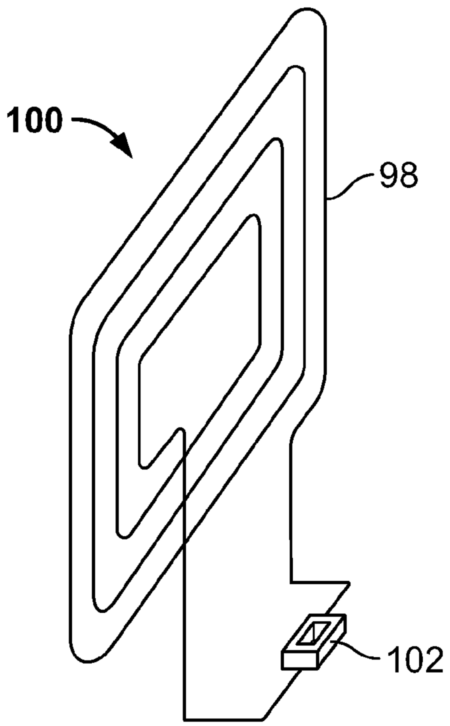
FIG. 8B depicts a modified version of the RFID tag of FIG. 8A, wherein a semiconductor chip is located in the horizontal plane and the coiled antenna is located in the vertical plane, according to an embodiment of the present invention.

When an IM is an RFID tag, the RFID tag is configured to communicate wirelessly via radio frequency (RF) waves for exchanging data with a reader (not shown). Several types of RFID products are known, such as the Texas Instruments' RI-103-114A-01 and ATMEL's AT88SCRF-ADK2. RFID tags have been employed in such diverse applications as driver licenses, passports, and bus, metro and, highway passes. Current RFID tag designs, such as the RFID tag 92 shown in FIG. 8A, include a semiconductor chip 94 and a coiled antenna 96. The RFID tag 92 is not suitable for mounting directly on a magnetron 29 or a reflector since the magnetron 29/reflector it is made of metal. The metal of the magnetron 29/reflector shields the coiled antenna 96, thereby reducing the production of sufficient current for "reading" RFID data stored from the semiconductor chip 94. An improvement is shown in FIG. 8B, wherein the magnetron 29/reflector does not shield a coiled antenna 98 of an RFID tag 100 because the coiled antenna is located in a vertical plane, while a chip 102 of the RFID tag 100 is located and mounted on the magnetron 29/reflector in a horizontal plane.

An alternative solution for implementing an IM is to employ a microcontroller with a very small footprint, such as the 8-bit PIC10F222T-I/OT microcontroller produced by Microchip Technology or the ATTINY10-TSHR produced by Atmel. The small footprint microcontroller type IM may be connected to the on lamp microprocessor board 52 via 3 to 5 wires. In such circumstances, the on lamp microprocessor 80 communicates with the small footprint microcontroller via the serial bus 88 over the serial bus port 90 to access information pre-written by the manufacturer of the part to be tracked.

A major difficulty in implementing an IM for use as a recognizer (BR) is the high operating temperature of the UV-emitting bulb 20. A fully-operating UV-emitting bulb 20 has a temperature in the range of about 700° C.-900° C., which may damage all but a few expensive military specification microcontrollers. In addition, the IM would be exposed to high levels of UV and microwave radiation. Therefore, adhering an inexpensive semiconductor-based IM to the UV-emitting bulb 20 is prohibitive.

An alternative implementation of a BR may take advantage of a characteristic of microwave-powered bulbs manufactured by Fusion UV Systems, Inc. of Gaithersburg, Md. Such bulbs contain a trace amount of an isotope of the radioactive element Krypton (i.e., "Kr 85"), which decays to non-radioactive byproducts after a predetermined amount of time (i.e., just enough to permit the microwave-powered bulb to reach operating temperature). If an irradiator does not employ Kr 85, the time for the microwave-powered bulb to ramp up to full operating temperature is significantly extended, resulting in potential harmful effects to the magnetron 29. In such circumstances, a sensor may be employed that recognizes the presence of Kr 85. A sensor that detects radiation emitted by Kr 85 may be remotely mounted at a safe distance from the UV-emitting bulb 20 within the irradiator 50. A radiation detector-based sensor may include, but is not limited to, a small Geiger counter, a CMOS or CCD imager that is operable with the on lamp microprocessor 80 to recognize the emission spectrum of Kr 85, or in a preferred embodiment, a PIN diode used as a radiation detector, such as the UM9441 or UM9442 manufactured by Microsemi Corp.

Still another approach for implementing a BR is to analyze the behavior of the UV-emitting bulb 20 in the presence of Krypton. During bulb ignition, the emission spectrum from the UV-emitting bulb 20 has a characteristic optical transition wavelength specific to Krypton. This optical transition wavelength will only be emitted when the UV-emitting bulb 20 is first ignited, when mercury pressure is very low. A photo detector may then be employed as the BR to detect the brief Krypton emission during ignition.

Certain internal parts of the irradiator 50 monitored by the IMs 54*a*-54*n* are intended to be disposable, such as, but not limited to, the UV-emitting bulb 20 and the primary reflector 16. All disposable parts inside the irradiator 50 may have pre-written information stored in the IMs 54*a*-54*n* as part of an inventory tracking system. Stored information may include, but is not limited to, a part number, a manufacturing date, and a life time limit. The data representing this information may be communicated from the IMs 54*a*-54*n* to the on lamp microprocessor 80 and then to the master computer processor 64 in the external power supply 60.

In operation, upon initial installation and any subsequent installation of each of the disposable parts, information stored in the IMs 54*a*-54*n* may be read by the on lamp microprocessor 80 over the serial bus 88. The on lamp microprocessor 80 assigns to each part a part ID. The on lamp microprocessor 80 records a start date and time for each of the monitored parts. The on lamp microprocessor 80 may compare the working time of the part to its expected maximum life time. When the working time approaches or exceeds a pre-established expiration date, the on lamp microprocessor 80 sends a message over serial bus cable 63 to the master computer processor 64 within external power supply 50, and from there to the user via the serial link 70 (e.g., a CAN bus serial link) and/or a network (e.g., the Internet), that it is time to check and/or replace the part. An external monitoring system at the user site may be configured to count and display the working time of each part. Additionally, the on lamp microprocessor 80 may store a life time limit for each part that is 20%-30% greater than the stated manufacturer's life time limit. When the working time exceeds the stored life time limit, the part and/or the irradiator 50 may be disabled by the master computer processor 64 or by shutting down the external power supply 60.

The irradiator 50 is upgradeable without requiring changes to the external power supply 60 or the cables 62, 63. For example, the irradiator 50 may be equipped with an optional non-contact infrared (IR) sensor employed as a temperature sensor. Employing a non-contact temperature sensor avoids damage due to potential overheating of the UV-emitting bulb 20, which may reach temperatures upwards of 1000° C. An exemplary IR sensor suitable for use in the irradiator 50 is a TPD 333/733 thermopile manufactured by Perkin Elmer.

Figure 4:
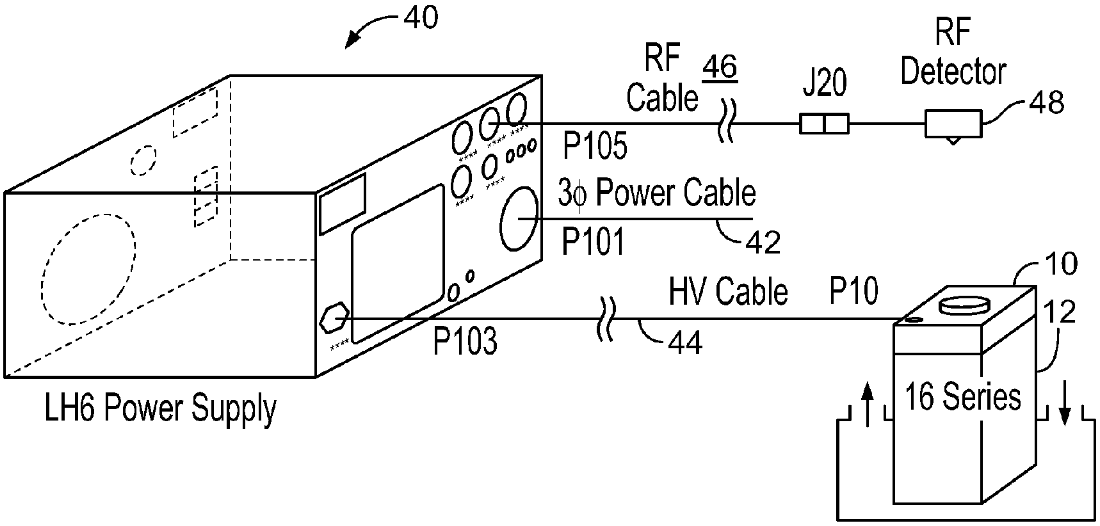
FIG. 4 shows a plurality of cable connections between the irradiator of FIGS. 1-3 and a conventional external power supply.

The irradiator 50 may also be equipped with an optional UV sensor for detecting the power level of UV radiation emitted by the UV-emitting bulb 20. A type of UV power sensor suitable for use in the irradiator 50 may include is a UV light power density photodiode. In the prior art irradiator 12, a measured output UV power level (not shown) is used as an aid for manual adjustment of UV light power output. The conventional external power supply 40 of FIG. 4 may be equipped (not shown) with a display that indicates only the percentage electric power needed for driving the magnetron 29.

Conventional irradiators 12 are operable to employ UV-emitting bulbs 20 of different lengths and types. For a particular length and type of the UV-emitting bulb 20, it is necessary for a user to manually employ an external UV light power detector to measure the UV light power emanating from the UV-emitting bulb 20. Employing an on-lamp UV power detector permits automatic adjustment and display of UV power without any manual calibration.

According to an embodiment of the present invention, referring gain to FIG. 6, one or more of the sensors 56*a*-56*n* may be replaced with one or more photo detectors operable to perform several of the functions outlined above, including Kr 85 characteristic measurements, UV power detection, and a light interlock function.

Figure 1:
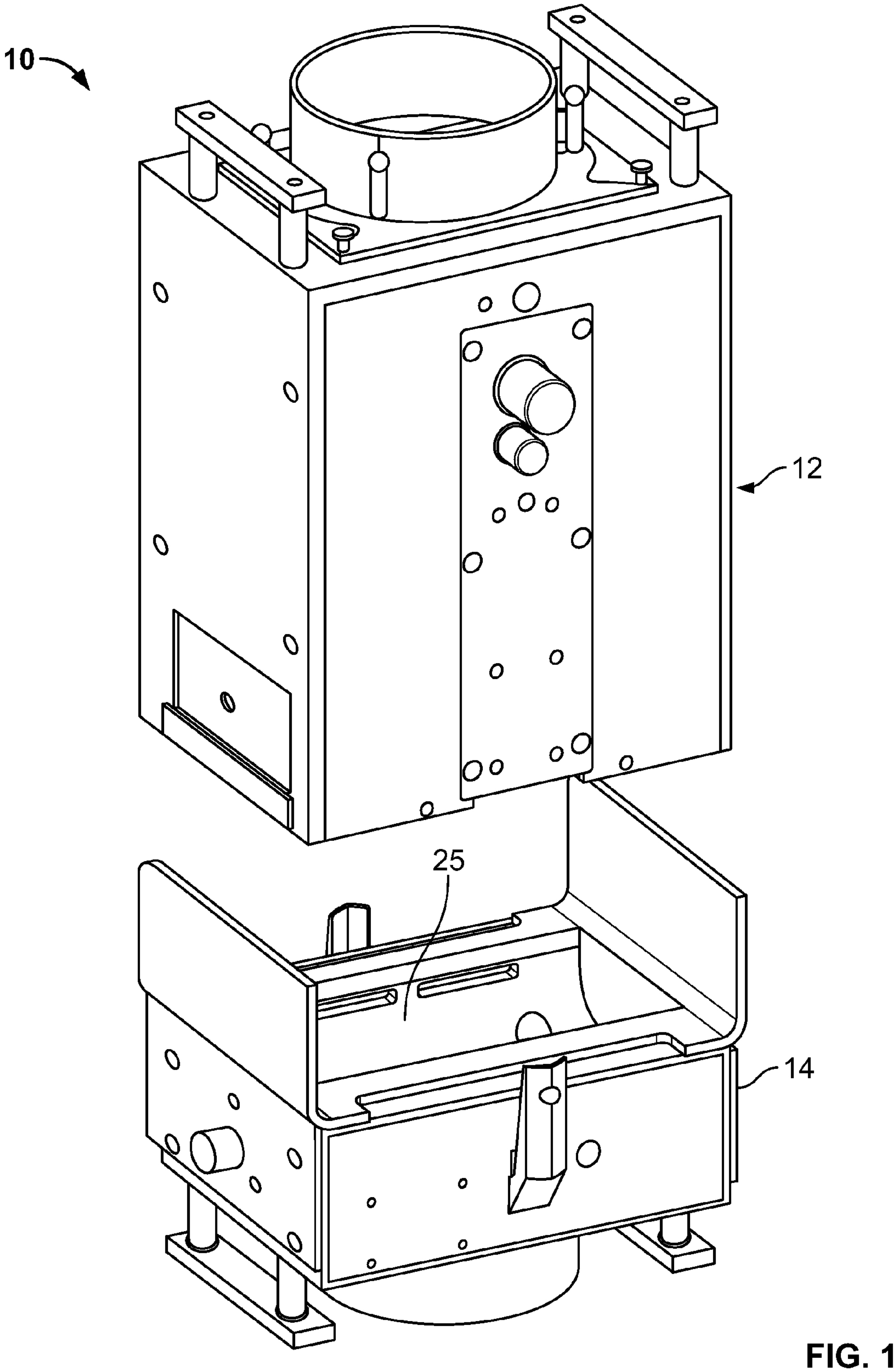
FIG. 1 (Prior Art)
FIG. 1 is a perspective view of a UV curing lamp assembly showing an irradiator and a light shield assembly in the prior art.
Figure 3:
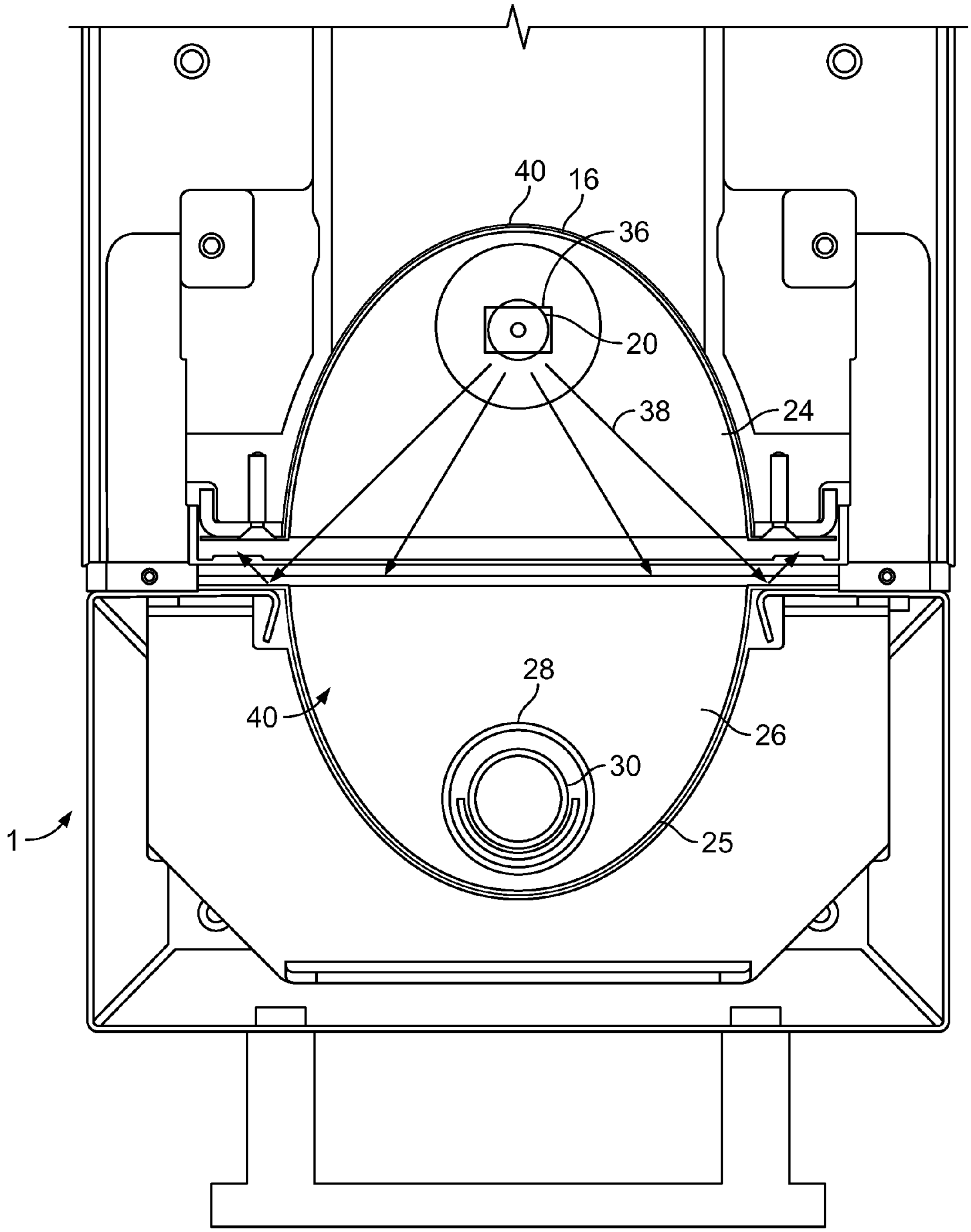
FIG. 3 (Prior Art)
FIG. 3 is a partial cross-sectional internal view of the lamp assembly interconnected with the light shield assembly of FIG. 1, showing a half-elliptical primary reflector and a light source of circular cross-section mated to a secondary reflector and end reflectors.

The irradiator 50 illustrated in FIGS. 5-8B has several advantages over the prior art irradiator 12 illustrated in FIGS. 1-3. The digital serial communication wires within the serial bus cable 63 are configured primarily for carrying device configuration, command, and status transmission. As a result, data flow between the on lamp microprocessor 80 and the master computer processor 64 is relatively low, thereby permitting the use of an inexpensive standard communication protocol/cables (e.g., a CAN bus). According to an embodiment of the present invention, the on lamp microprocessor 80 is responsible for processing data received from the plurality of sensors 56*a*-56*n* the IMs 54*a*-54*n* locally, with only processed results sent to the master computer processor 64.

Referring again to FIG. 6, since all of connections between the sensors 56*a*-56*n*, the IMs 54*a*-54*n* and the on lamp microprocessor board 52 are local connections within the irradiator 50, only wiring for power and serial communication within the HV cable 62 and the serial bus cable 63, respectively, are needed between the irradiator 50 and the external power supply 60. As a result, the HV cable 62 and the serial bus cable 63 are lower cost alternatives to the HV cable 44. Further, the quality of signals is improved, and the distance between the irradiator 50 and the external power supply 60 may be varied. In some application, it may be desirable to shorten the HV cable 62 and the serial bus cable 63 to improve signal transmission quality and reduce cabling costs. Alternatively, it may be desirable to increase the length of the HV cable 62 and the serial bus cable 63 so that the external power supply 60 and the irradiator 50 may be located on different floors of a facility. Still further, it is relatively easy to add additional sensors to the irradiator 50 without modifying the HV cable 62 and/or serial bus cable 63 and/or any port/board within the external power supply 60.

It is to be understood that the exemplary embodiments are merely illustrative of the invention and that many variations of the above-described embodiments may be devised by one skilled in the art without departing from the scope of the invention. It is therefore intended that all such variations be included within the scope of the following claims and their equivalents.

What is claimed is:

1. An intelligent ultraviolet curing apparatus, comprising:
an irradiator comprising a plurality of components;
a microprocessor mounted within the irradiator;
a plurality of intelligent markers in signal communication with the microprocessor and configured to monitor a plurality of components; and
a plurality of sensors in signal communication with the microprocessor and configured to sense a plurality of operating conditions associated with the plurality of components.

2. The apparatus of claim 1, wherein the plurality of intelligent markers comprises at least one of a radio frequency identification tag and a small footprint microcontroller.

3. The apparatus of claim 2, wherein the small footprint microcontroller is configured to be adhered to each monitored component.

4. The apparatus of claim 2, wherein the at least one radio frequency identification tag comprises a coiled antenna mounted in a vertical plane relative to a magnetron and an internal chip mounted in a horizontal plane relative to the magnetron.

5. The apparatus of claim 1, wherein the microprocessor is configured to communicate with each of the plurality of intelligent markers through a standard serial bus.

6. The apparatus of claim 5, wherein the standard serial bus is the serial peripheral interface bus.

7. The apparatus of claim 1 wherein each of the plurality of intelligent markers is configured to maintain manufacturing information including at least a produced date, a part number, and a life time limit.

8. The apparatus of claim 1, wherein the microprocessor is configured to:

recognize type and parameters of each of the plurality of components;

record accumulated working time of each of the plurality of components;

sample and process data from the plurality of sensors; and communicate with a master computer processor via a serial bus.

9. The apparatus of claim 8, wherein the serial bus is a CAN bus.

10. The irradiator of claim 1, wherein the plurality of monitored components is at least one of one or more magnetrons and a primary reflector.

11. The irradiator of claim 1, wherein the plurality of sensors is at least one of one or more temperature detectors operating as a bulb recognizer, an air pressure sensor for detecting a rate of air flow from an internal fan, a UV power sensor, and an RF detector for microwave leaking detection.

12. The apparatus of claim 1, wherein the plurality of sensors includes at least a bulb recognizer configured to recognize a presence of Kr 85 in a microwave-powered lamp within the irradiator.

13. The apparatus of claim 12, wherein the bulb recognizer is one of a Geiger counter, a CMOS or CCD imager operable with the microprocessor to recognize the emission spectrum of Kr 85, or a PIN diode.

14. The apparatus of claim 12, wherein the bulb recognizer is a photo detector configured to detect an initial ignition wavelength of Kr 85.

15. The apparatus of claim 12, wherein at least one of the plurality of components is disposable.

16. A method of operating and intelligent ultraviolet curing apparatus, comprising the steps of:

providing an irradiator comprising:

a plurality of components, a microprocessor mounted within the irradiator, and a plurality of intelligent markers and a plurality of intelligent markers in signal communication with the microprocessor;

monitoring, using the plurality of intelligent markers, the plurality of components; and sensing, using the a plurality of sensors, a plurality of operating conditions associated with the plurality of components.

17. The method of claim 16, further comprising:

reading, using the microprocessor, information stored in the intelligent markers upon initial installation and subsequent installation of a disposable component;

assigning to each of the plurality of monitored components a part ID; and recording a start date and time for each of the monitored components.

18. The method of claim 17, further comprising comparing a working time of a monitored component to its expected maximum life time.

19. The method of claim 18, further comprising, when the working time approaches or exceeds a pre-established expiration date, sending a message that indicates that it is time to check or replace the monitored component.

20. The method of claim 18, further comprising, when the working time approaches exceeds a stored life time limit, disabling the monitored component.

* * * * *